(12) United States Patent
Meyer et al.

(10) Patent No.: US 7,785,164 B2
(45) Date of Patent: Aug. 31, 2010

(54) METHOD FOR MAKING AN EMISSIVE CATHODE

(75) Inventors: Robert Meyer, Saint Nazaire les Eymes (FR); Brigitte Montmayeul, Bernin (FR)

(73) Assignee: Commissariat a l'Energie Atomique, Paris (FR)

( * ) Notice: Subject to any disclaimer, the term of this patent is extended or adjusted under 35 U.S.C. 154(b) by 331 days.

(21) Appl. No.: 11/915,222

(22) PCT Filed: May 29, 2006

(86) PCT No.: PCT/FR2006/050490

§ 371 (c)(1),
(2), (4) Date: Nov. 21, 2007

(87) PCT Pub. No.: WO2007/026086

PCT Pub. Date: Mar. 8, 2007

(65) Prior Publication Data

US 2008/0194168 A1 Aug. 14, 2008

(30) Foreign Application Priority Data

May 30, 2005 (FR) .................................. 05 51412

(51) Int. Cl.
*H01J 17/49* (2006.01)
*H01J 9/00* (2006.01)
(52) U.S. Cl. .......................... 445/24; 313/495; 313/497
(58) Field of Classification Search ............. 445/24–25; 313/495–497
See application file for complete search history.

(56) References Cited

U.S. PATENT DOCUMENTS 5,817,201 A * 10/1998 Greschner et al. ........... 156/150

(Continued)

FOREIGN PATENT DOCUMENTS

FR 2 829 873 3/2003

(Continued)

OTHER PUBLICATIONS

U.S. Appl. No. 11/632,944, filed Jan. 19, 2007, Dijon, et al.

*Primary Examiner*—Nimeshkumar D Patel
*Assistant Examiner*—Anne M Hines
(74) *Attorney, Agent, or Firm*—Oblon, Spivak, McClelland, Maier & Neustadt, L.L.P.

(57) ABSTRACT

A method for manufacturing a triode type cathode structure including depositing and etching: a cathode layer as cathode conductors; a grid layer as grid conductors; an electrical insulation layer and the grid conductors until reaching a resistive layer to provide cavities; and the cathode conductors to have a perforated structure at the intersection of the cathode conductors and grid conductors. Etching the grid conductors and the electrical insulation layer includes: a) depositing a resin layer on the grid layer, b) lithography and development of the resin layer according to a pattern that will form emissive pads, c) etching the grid layer according to the pattern, d) etching the insulation layer subjacent to the grid layer by extending the etching beyond emissive pad patterns, e) etching the grid layer at zones exposed by etching the insulation layer until reaching the resin layer, f) depositing a catalyst layer in openings of the resin layer to form emissive pads at the bottom of the cavities, and g) eliminating the resin layer.

8 Claims, 7 Drawing Sheets

U.S. PATENT DOCUMENTS

| | | | |
|---|---|---|---|
| 5,872,422 A | 2/1999 | Xu et al. | |
| 6,062,931 A | 5/2000 | Chuang et al. | |
| 6,803,708 B2 * | 10/2004 | Simon et al. | 313/311 |
| 7,304,420 B2 * | 12/2007 | Rose et al. | 313/309 |
| 2003/0184357 A1 * | 10/2003 | Dijon et al. | 327/301 |
| 2004/0256969 A1 * | 12/2004 | Dijon et al. | 313/310 |
| 2007/0222357 A1 | 9/2007 | Dijon et al. | |

FOREIGN PATENT DOCUMENTS

| | | |
|---|---|---|
| FR | 2 836 279 | 8/2003 |
| FR | 2 873 852 | 2/2006 |
| WO | 03 021621 | 3/2003 |

\* cited by examiner

METHOD FOR MAKING AN EMISSIVE CATHODE

TECHNICAL DOMAIN

The invention relates to a method for manufacturing an emissive cathode comprising a cathode layer structured as columns, a grid layer structured as rows and emissive pads, the emissive pads being self-aligned with the rows of the grid layer. According to one particular embodiment, the emissive pads are also self-aligned with the columns of the cathode layer.

STATE OF PRIOR ART

Cathode structures are used mainly in cathodo-luminescence display devices excited by field emission and particularly in flat field emission screens. These field emission display devices comprise a cathode, that emits electrons, and an anode, facing the cathode, coated with one or several luminescent layers. The anode and cathode are separated by a space kept under a vacuum.

The cathode is either a microtip-based source, or a low threshold field emissive layer-based source. If it is a low threshold field emissive layer, it may be composed of nanostructures such as nanotubes, nanowires or nanofilaments; these nanostructures are made of an electrically conducting material, for example such as carbon; they may also be composed of multi-layers (for example AlN or BN multi-layers).

The cathode structure may be of the diode or triode type. Triode structures have an additional electrode called a grid that controls extraction of electrons.

For application to flat screens, a cathode with a triode structure is used because this particular structure provides the means of separating the control voltage (grid voltage) from the anode voltage. The control voltage must be low to minimize the cost of addressing transistors (<<drivers>>), while the anode voltage must be as high as possible to improve the light efficiency of the cathode and to minimize energy consumption.

Triode type cathodes are composed of rows and columns, the intersection of a row and a column defining a pixel. During operation of the cathode, the data to be displayed are brought onto the columns, while the rows are scanned sequentially so as to address the entire screen, in other words all pixels on the screen.

A triode type cathode is described in application FR 2 836 279 filed on Feb. 19, 2002, and is shown in FIGS. 1A and 1B. This cathode comprises the following elements:

- a first conducting level composed of a cathode layer structured in the form of columns 7,
- a resistive layer 2 (for example made of amorphous silicon) to improve the uniformity of electron emission,
- a layer of insulating material 6 (for example a silica layer) placed between the resistive layer 2 and the second conducting level 10,
- a second conducting level 10 composed of a grid layer 8 structured in the form of rows 9, the potential of this second level being used to control the extraction of electrons,
- electron emitting means, for example carbon nanotubes located on pads 14 deposited on the resistive layer 2 in a cavity 16. This cavity 16 is made by etching the grid layer 8 and the layer 6 made of an insulating material. Typically, the width of a cavity 16 is 10 to 15 µm and the grids are laid out with a pitch of 20 to 25 µm between the rows.

FIG. 1A shows that cavities 16 are etched in the rows 9 at the intersection of the rows 9 and the columns 7 and that the rows are also etched outside these intersections to form thinner rows 11.

As can be seen in FIG. 1A, the columns 7 of the cathode layer have a particular perforated structure 13, forming sub-columns 4 on which the resistive layer 2 is deposited. Pads 14 must be positioned in cavities between the sub-columns such that the electrical connection of the sub-columns 4 to the pads 14 is made through the resistive layer 2.

One manufacturing method known for manufacturing this triode type cathode structure is described in application FR 2 836 279 mentioned above and is shown in FIGS. 2A to 2F. The method comprises the following steps:

- deposit a layer of conducting material on a support 1 and etch this layer so as to form columns and sub-columns 4, inside these columns at zones that will become the intersection of rows and columns (only two sub-columns 4 are shown in FIG. 2A),
- deposit a solid layer of a resistive layer 2, an insulating layer 6, followed by a conducting layer 10 (FIG. 2B)
- etch the conducting layer 10 and the insulating layer 6 so as to expose the resistive layer 2 to form the cavity 16 (FIG. 2C),
- deposit a sacrificial layer 17 made of resin and form openings 18 in the sacrificial layer 17 exposing the resistive layer 2 (FIG. 2D),
- deposit a catalytic layer 19 on the structure (FIG. 2E),
- eliminate the sacrificial layer 17,
- growth of an emissive layer 12 (for example carbon nanotubes) on the remaining catalytic layer 19, present on the resistive layer 2, to form emissive pads 14 (FIG. 2F).

The disadvantage of this method is that two precise alignments are necessary, a first alignment of cavities 16 with respect to the sub-columns 4 with a precision of the order of 1 to 2 µm (FIG. 2C), and a second alignment of emissive pads 14 with respect to grids 10 with a precision of at least 0.5 µm (FIG. 2D). An offset of the cavities 16 with respect to the sub-columns 4 causes a variation in the access resistance of sub-columns to emissive pads through the resistive layer. This variation remains of the second order provided that the offset does not exceed 2 µm. An offset of the pads 14 from the grids 10 leads to a disymmetric field on the nanotubes (present on pads 14) that defocuses the electron beam and degrades the resolution of pixels in the screen.

In the method as described in application FR 2 836 279, this alignment precision is obtained by a lithography step (FIG. 2D). But the lithography has to be done on large surfaces (of the order of 1 m$^2$), which creates a problem that is difficult to control efficiently, and using lithography equipment compatible with a low cost method.

PRESENTATION OF THE INVENTION

The purpose of the invention is to improve the known method so as to reduce the number of necessary alignments.

This purpose and others are achieved according to the invention by a method for manufacturing a triode type cathode structure comprising:

- steps to deposit a cathode layer made of an electrically conducting material, a resistive layer, a layer made of an electrically insulating material, a grid layer made of electrically conducting material on one face of a substrate, so as to form a stack, the grid layer forming the surface layer of the stack and being adjacent to the insulation layer, steps of structuring of:
the cathode layer to create the cathode conductors structure arranged in the one structure chosen among either a rows structure or a columns structure,
the grid layer to create the grid conductors structure arranged in the other structure chosen among either a rows structure or a columns structure,
steps to etch:
the electrical insulation layer and the grid layer structured as grid conductors until reaching the resistive layer so as to provide cavities at the intersection of grid conductors and cathode conductors,
the cathode layer structured as cathode conductors to give it a perforated structure at the intersection of cathode conductors and grid conductors,
the method being characterised in that steps to etch the grid layer structured as grid conductors and the electrical insulation layer are carried out by:
a) deposition of a resin layer on the grid layer structured as grid conductors,
b) lithography and development of the resin layer to obtain openings in the resin layer organised according to a pattern that will form emissive pads at the bottom of the cavities,
c) etching of the grid layer structured as grid conductors, according to the pattern,
d) etching of the insulation layer subjacent to the grid layer structured as grid conductors by extending the etching beyond emissive pad patterns to obtain a width L of the cavity greater than the width of the pads,
e) etching of the grid layer structured as grid conductors, included between the resin layer and the resistive layer at zones exposed by etching of the insulation layer until reaching the resin layer,
f) deposition of a catalyst layer in the openings of the resin layer so as to form emissive pads at the bottom of the cavities,
g) elimination of the resin layer.

According to a first embodiment, the structuration of the cathode layer as cathode conductors, and the etching of said cathode layer structured as cathode conductors to give it a perforated structure, are done before deposition of the resistive layer.

According to a second embodiment, the structuration of the cathode layer as cathode conductors is done before the insulation layer is deposited, and the insulation layer and the cathode layer structured as cathode conductors being located between the grid layer structured as grid conductors and the resistive layer, step e) is completed by etching the cathode layer structured as cathode conductors at zones exposed by etching of the insulation layer until the resistive layer is reached, so as to give a perforated structure to the cathode layer structured as cathode conductors.

According to another embodiment, a barrier layer is deposited as a barrier to diffusion of the catalyst in the openings in the resin layer, before a catalyst layer is deposited in step f).

According to a first variant, the structuration of the cathode layer as cathode conductors or/and the structuration of the grid layer as grid conductors is (are) done by etching through a mask obtained by photolithography.

Advantageously, according to the second embodiment, the structuration of the cathode layer as cathode conductors is completed by etching at least part of the thickness of the resistive layer at the zones exposed by the etching of the cathode layer structured as cathode conductors. The resistive layer may thus be etched, for example during the same lithography step as that used to etch the cathode layer in cathode conductors, which perfectly isolates cathode conductors from each other and prevents leakage currents between cathode conductors during operation of the screen. This embodiment is particularly useful when it is required to minimize consumption of electricity. Note that the resistive layer is etched between columns, but not within a column.

According to a second variant, the structuration of the cathode layer as cathode conductors or/and the structuration of the grid layer as grid conductors is (are) done by deposition through a metallic mask.

Advantageously, step g) to eliminate the resin layer is done by <<lift-off>> or by dissolution of the resin layer.

Advantageously, the production method also includes a growth step of nanotube, nanowire or nanofilament type nanostructures on the catalyst layer to form the emissive pads.

Advantageously, step d) to etch the insulation layer is a wet isotropic etching. Isotropic etching provides a means of obtaining a cavity centred in the insulation layer with respect to the pattern of pads defined in the resin layer.

The method according to the invention can be used to make cathode structures that can be used particularly in flat field emission screens and/or in <<backlight>> for LCD (liquid crystal display) screens.

BRIEF DESCRIPTION OF THE DRAWINGS

The invention will be better understood and other advantages and special features will appear after reading the following description given as a non-limitative example accompanied by the attached drawings among which.

It should be noted that the different elements shown in these figures are not drawn to scale.

DETAILED PRESENTATION OF PARTICULAR EMBODIMENTS

The originality of the manufacturing method according to the invention is based on the use of a single resin layer to etch the grid layer structured as grid conductors through openings made in the resin layer, etching the insulation layer by extending the etching laterally under the grid layer to obtain cavities, etching the exposed grid layer under the resin layer and depositing a catalyst layer on the resistive layer at the bottom of the cavities in the openings made in the resin layer.

According to a first variant of the production method according to the invention, the emissive pads can be self-aligned with respect to the grid conductors, in other words the emissive pads can be positioned with respect to the grid conductors without needing to align the pads on the cavities made in the grid layer, which eliminates one of the constraints according to prior art. According to a second variant, the emissive pads can also be self-aligned with respect to the grid conductors and to the cathode conductors; the two alignment constraints according to prior art are thus eliminated.

The different steps in the first variant are shown in FIGS. 3A to 3F.

On one of the faces of a support substrate 21, for example a 1.1 mm thick borosilicate glass substrate, a layer of conducting material, for example a 0.2 μm thick layer of molybdenum, is deposited by evaporation with an electron gun. If necessary, the support substrate can be cleaned by known basic washing means before the conducting layer is deposited.

Figure 1A:
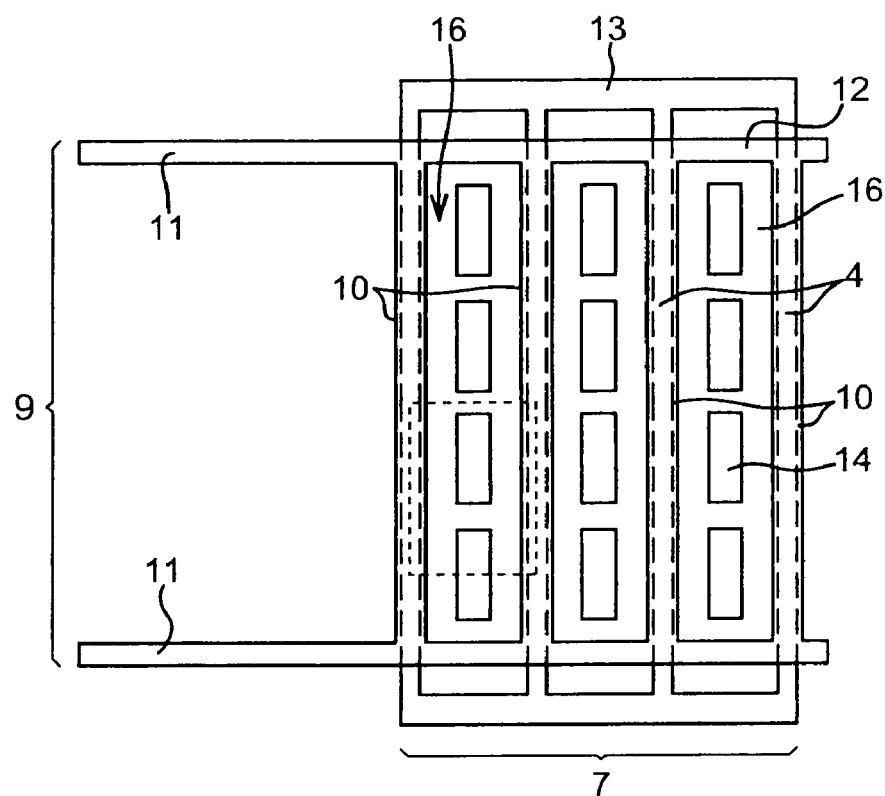
FIG. 1A, already described, is a top view of a triode type cathode structure according to prior art, FIG. 1B, already described, is a sectional view of an enlarged part of the cathode structure shown in FIG. 1A in dashed lines, FIGS. 2A to 2F, already described, illustrate a method for manufacturing a triode type cathode structure according to prior art.
Figure 1B:
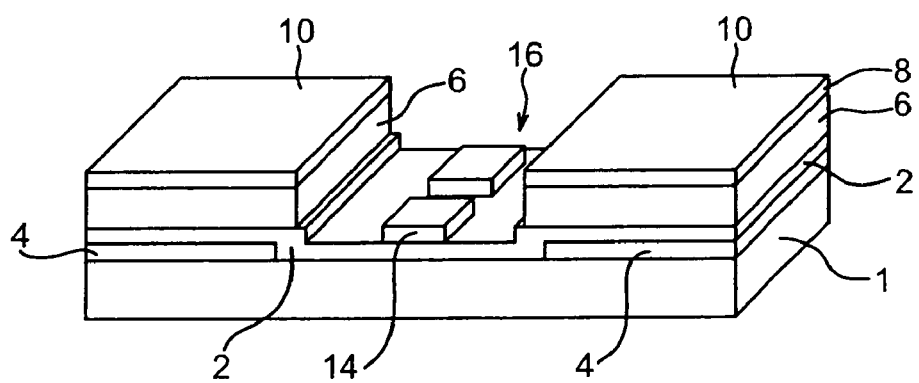
Figure 2A:
Figure 2B:
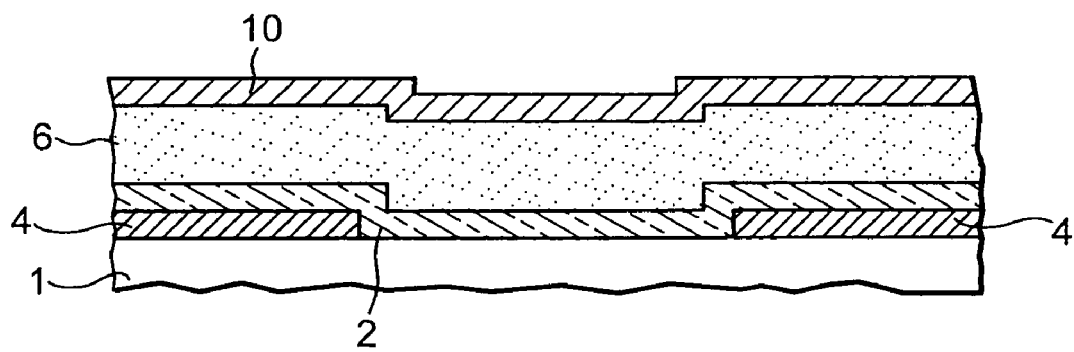
Figure 2C:
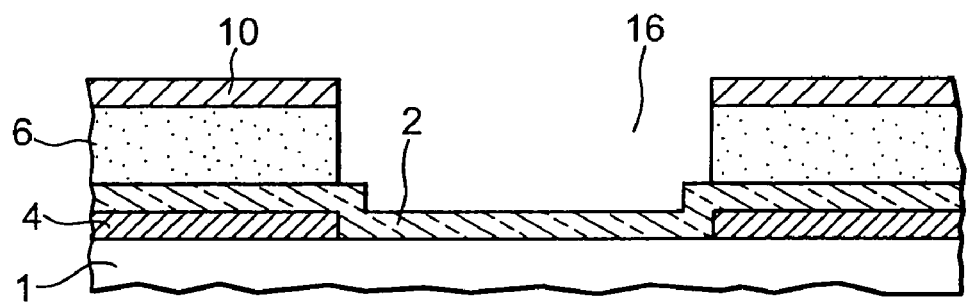
Figure 2D:
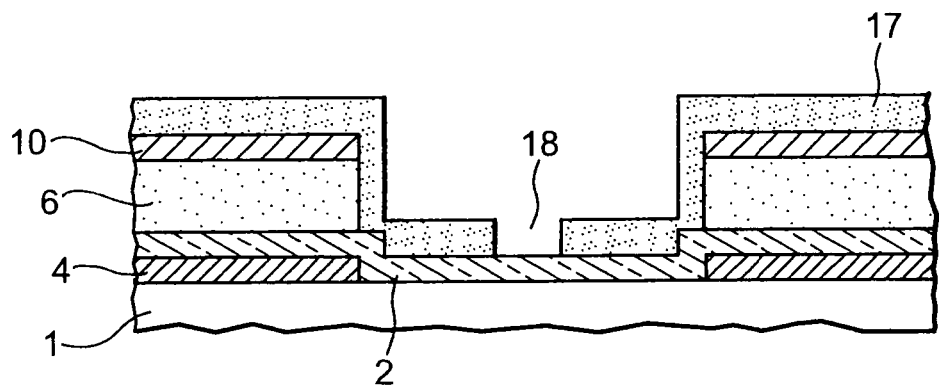
Figure 2E:
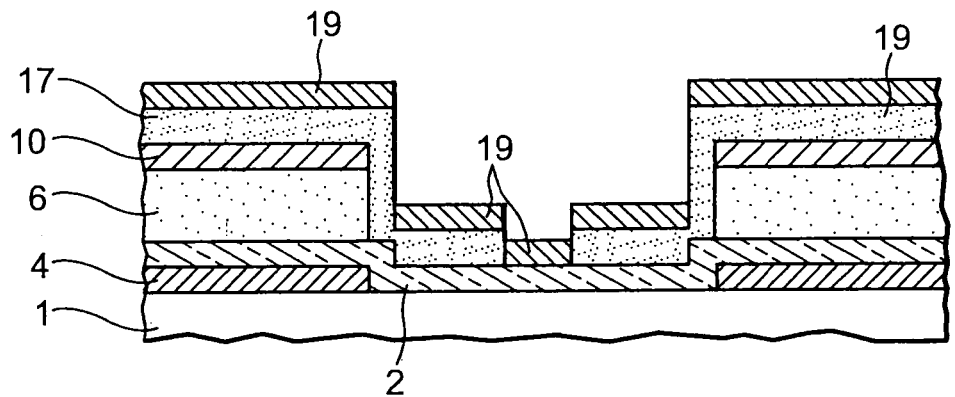
Figure 2F:
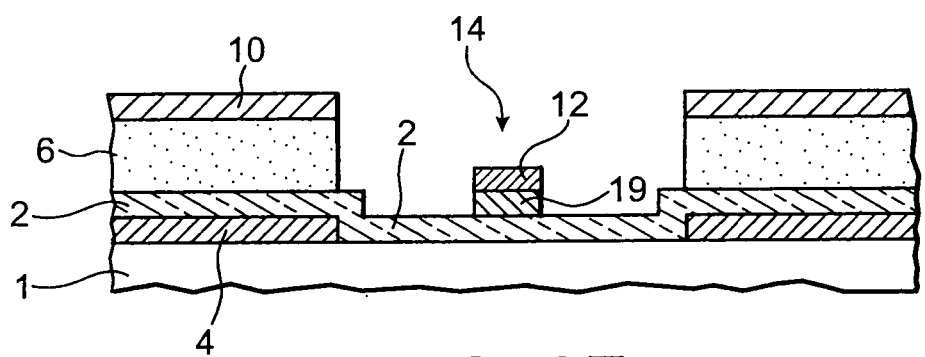
Figure 3A:
FIGS. 3A to 3F illustrate a first embodiment of the method according to the invention.

The next step is the lithography and etching of this conducting layer so as to structure this layer in columns and sub-columns: the result obtained is then a structured cathode layer 24 (only two sub-columns are visible in FIG. 3A). In this example, the columns are laid out at a pitch of 350 μm with a space of 50 μm between the columns, and the widths of sub-columns are between 5 and 10 μm and their spacing is 10 to 15 μm. The sub-columns are etched so as to obtain perforated structures at the locations corresponding to the superposition of cathode conductors (columns) and grid conductors (rows). For example, the sub-columns are made to be parallel to the columns. As a variant, they may be made differently as described in document FR 2 873 852. The result is thus a perforated structure like that shown in FIG. 1A in prior art. The following steps, well known to those skilled in the art, are used to make these columns and sub-columns in the cathode layer:

- a resin layer is deposited with a spin coater, for example a 1.2 μm thick layer,
- exposure of the resin with proximity lithography equipment through a mask,
- development of the resin,
- etching of the cathode layer; since it is a molybdenum layer, etching is done by reactive ionic etching (RIE) with an $SF_6$ gas,
- dissolution of the resin and cleaning.

Figure 3B:
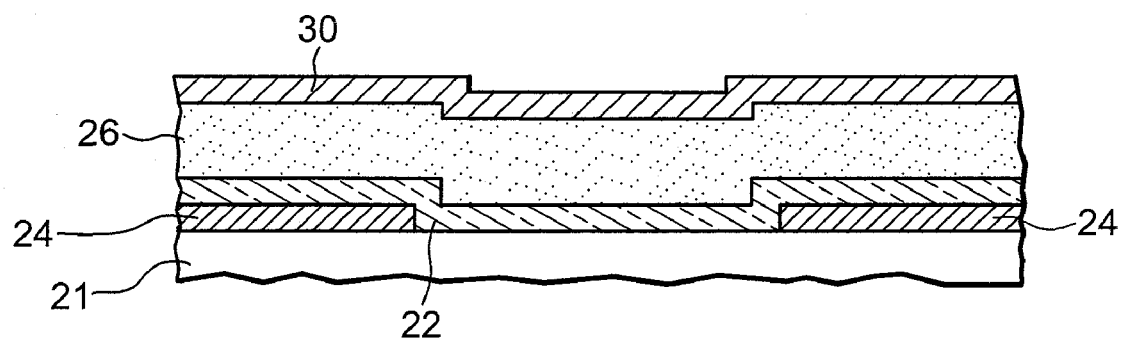

The next step is to deposit a resistive layer 22 on the face of the support substrate 21 on which the structured cathode layer 24 is located (for example a 1 μm thick amorphous silicon layer doped with phosphorus, deposited by cathodic sputtering), an insulation layer 26 (for example a 1 μm thick layer of silica deposited by chemical vapour phase deposition (CVD)) and a grid layer 30 (for example a 0.2 μm thick molybdenum layer deposited by evaporation with an electron gun) (FIG. 3B).

The grid layer 30 is then lithographed and etched so as to form lines at a pitch of 350 μm and a spacing of 50 μm, according to the same principle as that described above for etching columns in the cathode layer: the result is thus a structured grid layer 300.

The next step is to use the spin coater to deposit a 1.2 μm thick resin layer 27 on the structured grid layer 300, and this resin layer 27 is lithographed in a pattern with the shape of the emissive pads 34 to be formed on the resistive layer 22. For example, the patterns may be 3 to 10 μm wide rectangles. The patterns of the pads must be centred with a precision of the order of 1 to 2 μm in the 10 to 15 μm space separating the column conductors 300. In this example, lithography is done to obtain pads 34 with side dimensions 4.5×4.5 μm. The resin layer 27 is exposed using proximity lithography equipment, and the resin is then developed.

Figure 3C:
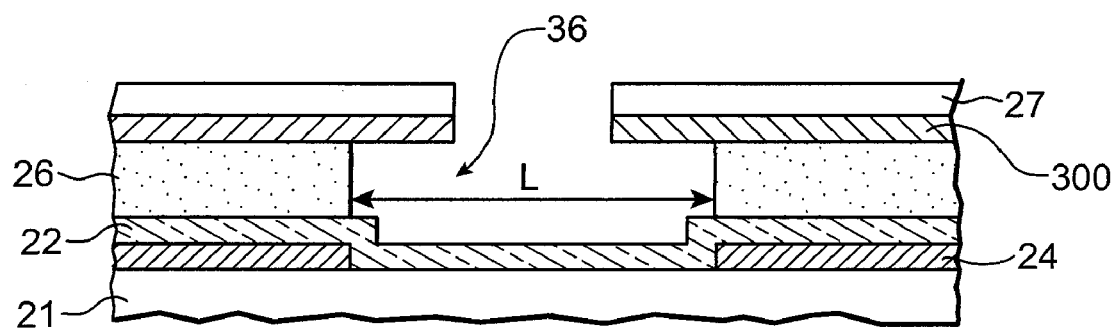

The structured grid layer 300 is then etched according to the pattern. The structured grid layer 300 may be etched by wet etching or dry etching; in this example, the molybdenum layer is etched by RIE. The insulation layer 26 is then wet etched. This etching is done until the insulation layer is etched over a width L greater than the width of the patterns that will form the emissive pads 34, but less than or equal to the distance separating two adjacent sub-columns 24 (FIG. 3C). The etching time of the insulation layer 26 determines the width L of the cavity 36 in the insulation. The nature of the insulation is chosen so as to obtain an isotropic etching by a chemical process. In this way, the cavity 36 with width L is centred with respect to the pattern of the pads 34 defined in the resin layer 27. In this example, the insulation layer 26 made of silica is chemically etched with the $NH_4F,HF$ mix. The etching time is 8 minutes 30 seconds, sufficient to obtain a cavity 36 in the silica layer with a width L=11 μm.

Figure 3D:
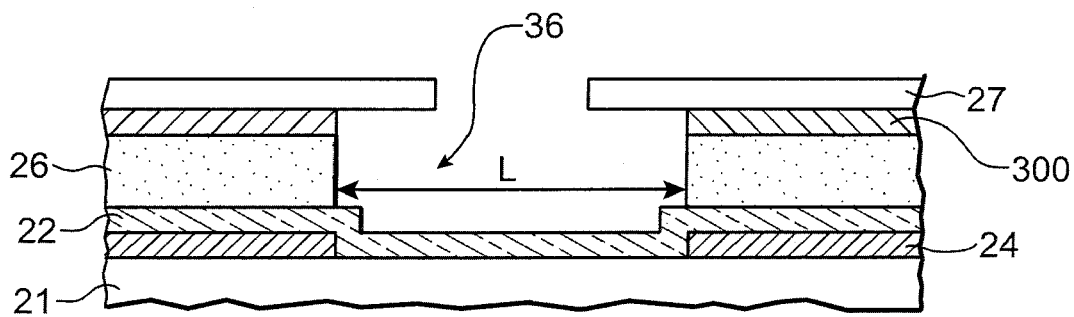

The next step is wet etching of the structured grid layer 300 exposed by etching of the insulation layer 26 and present underneath the resin layer 27 (FIG. 3D). The structured molybdenum grid layer 300 is etched chemically using a <<Cr Etch>> type bath: the attack time is 2 minutes. Finally, rinsing is done with the ionised water and the stack is dried.

Figure 3E:
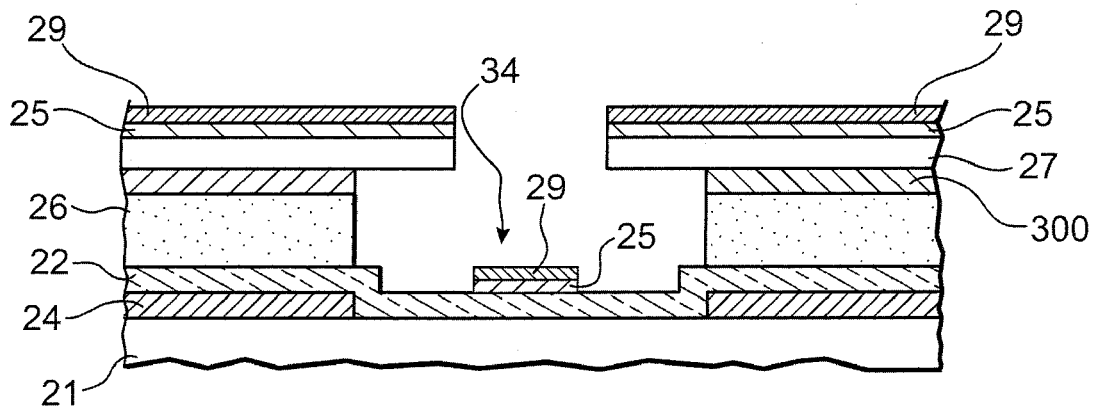

The next step is to deposit a barrier layer 25 and a catalyst layer 29 through the resin mask, in other words on the resin layer 27 and in the openings formed in this resin layer 27 (FIG. 3E). The barrier layer 25 deposited between the resistive layer 22 and the catalyst layer 29 is not essential, but it does make it easier to control growth of nanotubes (partly by avoiding diffusion of the catalyst) and/or improve electrical contacts between nanotubes and the resistive layer. Thus, the result is emissive pads 34 on the resistive layer 22 located at equal distances from the grid conductors of the structured grid layer 300. In this example, an 80 nm thick TiN barrier layer 25 is deposited by cathodic sputtering through the resin mask, and a 10 nm thick nickel catalyst layer 29 is deposited by evaporation with an electron gun.

Finally, the resin layer 27 is eliminated, for example using the lift-off technique.

Figure 3F:
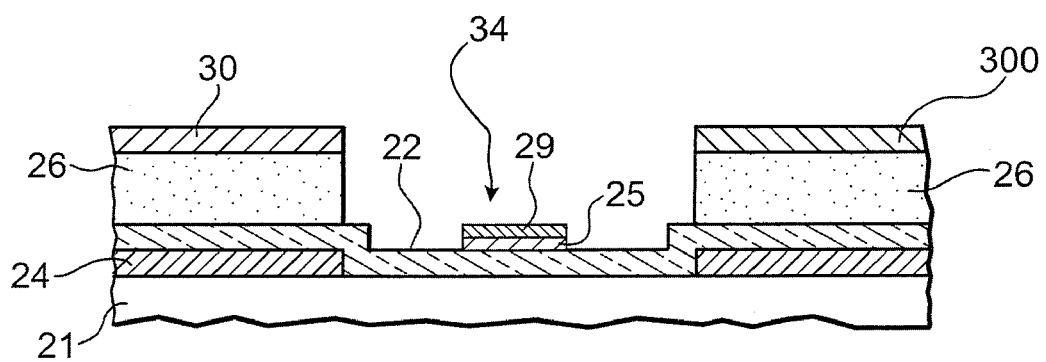

As can be seen in FIG. 3F, the result obtained is then a triode type cathode structure comprising a support substrate 21 on which a structured cathode layer 24 is obtained in columns and sub-columns, a resistive layer 22 covering this structured cathode layer 24, an insulation layer 26 having cavities 36 between two adjacent sub-columns, this insulation layer being covered with a structured grid layer 300 structured as rows, emissive pads 34 being located in the cavities 36 on the resistive layer 22. Once the structure is finished, nanostructures can be grown on the catalyst layer 29. The catalyst is chosen as a function of the electron emitting material to be grown on the catalyst layer. For example, a layer of a nickel catalyst is deposited to make carbon nanotubes grow.

In the second variant, the first step is to deposit a resistive layer 22 on the face of the support substrate 21, and a cathode layer is then deposited and etched to structure it according to columns 40. Unlike the first variant, the perforated structure of the columns (formation of sub-columns) is obtained by etching through openings made in the resin layer 27, once the insulation layer 26 has been etched. This second variant can thus obtain a completely self-aligned method: the emissive pads 34 are centred with respect to the rows in the structured grid layer 300 and with respect to the sub-columns in the structured cathode layer 400. This method is capable of eliminating the constraint related to the obligation to make an alignment within the order of one micrometer. With this variant of the method, all that is necessary is to position the emissive pads 34 on the rows and columns, which requires precisions of the order of a few tens of micrometers, which is very easy to achieve by low cost lithography on very large surfaces of the order of 1 $m^2$.

The steps in this variant of the embodiment are shown in FIGS. 4A to 4F.

As in the previous example, a 1.1 mm thick borosilicate glass is used as a support substrate 21. The support substrate 21 may possibly be cleaned by known basic type washing means. A 1 μm thick resistive layer 22 made of amorphous silicon doped with phosphorus is deposited on one of the faces of the support substrate, for example by cathodic sputtering. The next step is to deposit a layer of electrically conducting material that will form the cathode layer, for example a 0.2 μm thick layer of molybdenum by evaporation with an electron gun. The cathode layer is then lithographed and etched, for example by RIE etching, so as to form columns arranged at a pitch of 350 μm and a spacing of 50 μm, using the principle described above (deposition of the resin, exposure and development of the resin, etching of the cathode layer, dissolution of the resin): the result obtained is thus a cathode layer structured as cathode conductors 40 (columns). In this embodiment, the columns are solid, in other words without the characteristic perforated structure of the first variant: the perforated structure of the columns will be obtained later during the process.

Advantageously, etching can be continued and in addition to the cathode layer, the resistive layer 22 present between the cathode conductors (columns) is etched. As we have already seen, etching of the resistive layer 22 is attractive when the problem of electricity consumption is critical.

Figure 4A:
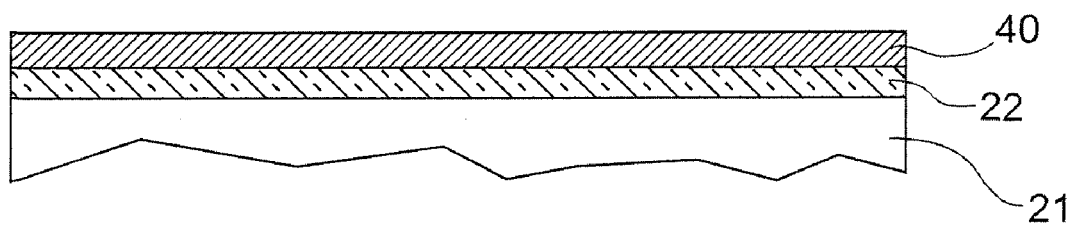
FIGS. 4A to 4F illustrate a second embodiment of the method according to the invention.
Figure 4B:
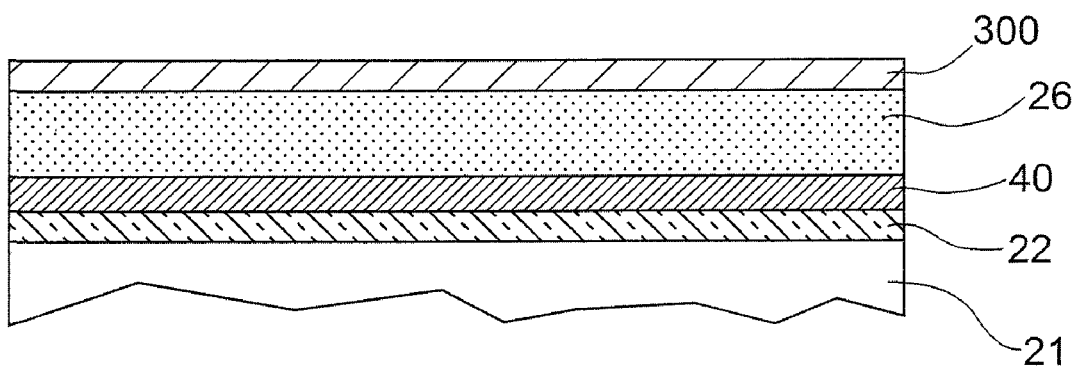

As shown in FIG. 4B, the next step is to deposit an insulation layer 26 on the cathode layer structured as cathode conductors 40 (for example a 1 μm thick silica layer deposited by CVD), followed by a layer made of an electrically conducting material to form the grid layer (for example a 0.2 μm thick molybdenum layer deposited by evaporation with an electron gun). The grid layer is then lithographed and etched so as to form grid conductors (rows) arranged at a pitch of 350 μm and at a spacing of 50 μm based on the same principle described for etching of cathode conductors (columns) in the cathode layer: the result obtained is thus a structured grid layer 300.

Figure 4C:
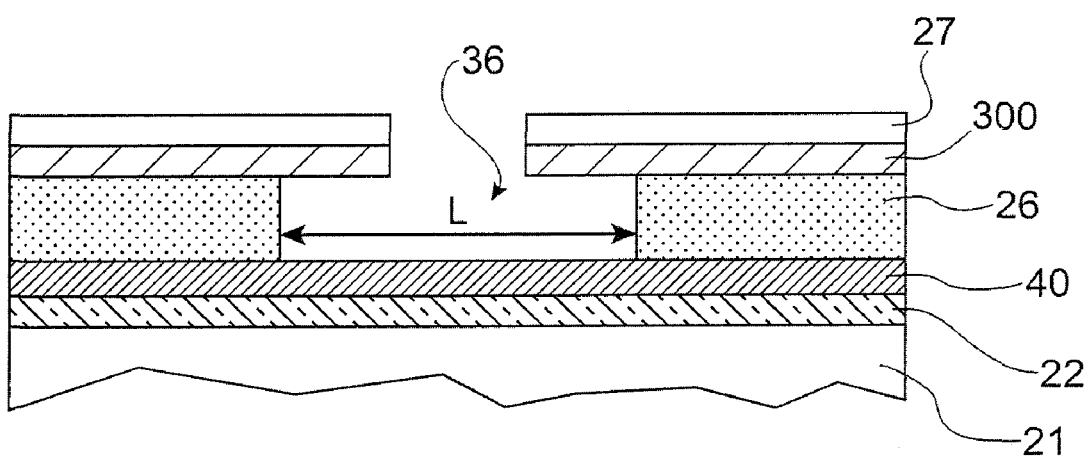

The next step is then to deposit a 1.2 μm thick resin layer 27 on the structured grid layer 300, and this resin layer 27 is lithographed and etched according to a pattern designed to form emissive pads 34, for example pads with 4.5×4.5 μm side dimensions on the resistive layer. To achieve this, the structured grid layer 300 is etched by dry or wet etching according to the pattern of the resin layer 27. In this example, the structured grid layer 300 made of molybdenum is etched by RIE. The next step is wet etching of the insulation layer 26 for an etching time that, as in the first variant, determines the width L of the cavity 36 (FIG. 4C). The insulation layer 26 is etched using an $NH_4F,HF$ mix in the case in which the insulating material is $SiO_2$, and the etching time is 8 minutes 30 seconds, to obtain a cavity 36 in the silica layer with a width L=11 μm.

Figure 4D:
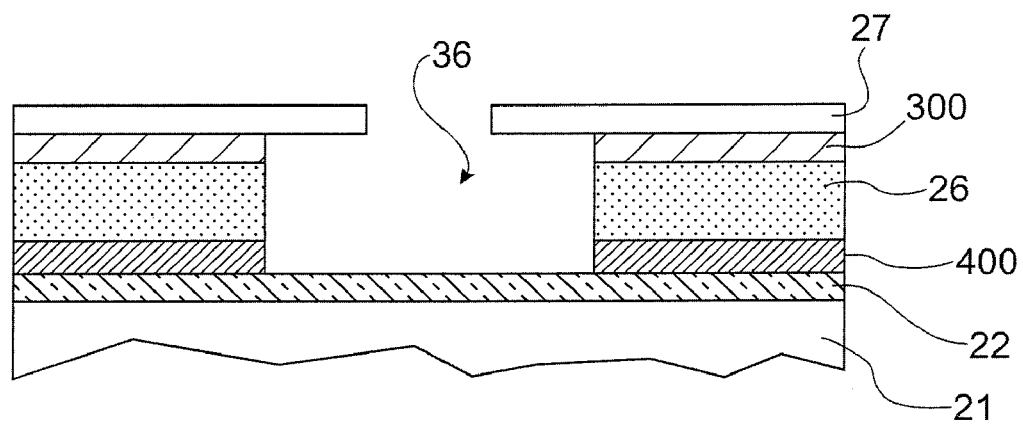

The structured grid layer 300 exposed under the resin layer and the cathode layer structured as cathode conductors 40, present at the bottom of the cavity 36, are wet etched (FIG. 4D). The result is that sub-columns and the perforated structure of cathode conductors are formed: the result is a cathode layer 400 structured as columns and in sub-columns. These layers are made of molybdenum and are etched with a <<Cr Etch>> type bath for 2 minutes, and the structure is then rinsed with de-ionising water and dried.

Figure 4E:
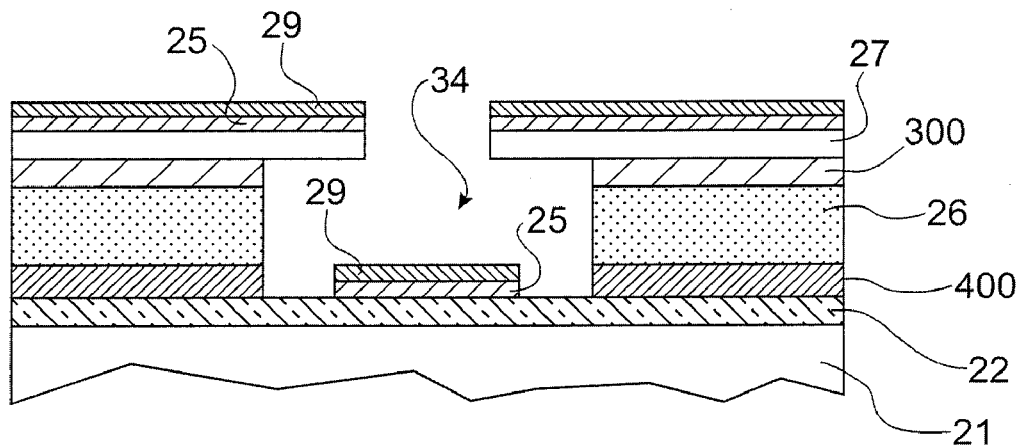

The next step is to deposit a catalyst layer, or a barrier layer 25 and a catalyst layer 29, through the resin mask, in other words on the resin layer 27 and in the openings formed in this resin layer. In this example, the first step is to deposit an 80 nm thick TiN barrier layer 25 by cathodic sputtering through the resin mask, and the next step is to deposit a 10 nm thick nickel catalyst layer 29 by evaporation with an electron gun (FIG. 4E). As in the previous variant, the result obtained is emissive pads 34 on the resistive layer 22, located at equal distances from the grid layer structured as grid conductors 300.

Figure 4F:
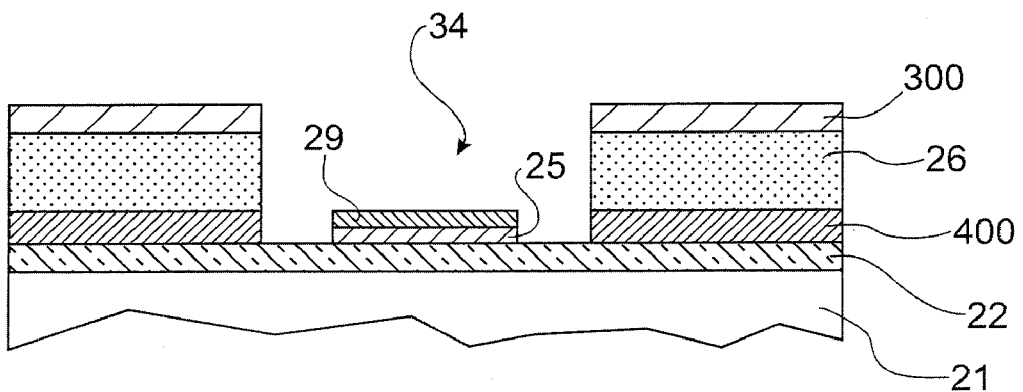

Finally, the resin layer 27 is eliminated, for example by dissolution of the resin (FIG. 4F).

Nanotubes can then be grown on the pads of the structure thus obtained.

This variant of the method has the advantage that the cavities 36 in the grid layer structured as grid conductors 300 and in the insulation layer 26, formation of the perforated structure of cathode conductors (formation of the structured layer 400 from the cathode layer structured as cathode conductors 40), and the deposition of emissive pads 34 through the resin mask are done with the same lithography level, in other words with the same mask obtained by lithography of the resin layer 27 to form the patterns of emissive pads (FIGS. 4C to 4E). The distance firstly between the pads 34 and the grid conductors (rows) of the structured grid layer 300, and secondly between the pads 34 and the sub-columns of the structured cathode layer 400, is determined by the etching time of the insulation layer 26. Thus, the emissive pads 34 are automatically centred with respect to the grid conductors (rows) and the sub-columns of cathode conductors (columns). This thus eliminates the two alignment constraints in prior art.

In the case of applications such as backlighting of LCD screens in which the pitches separating the cathode conductors (columns) and grid conductors (rows) are of the order of one millimetre, it is possible to deposit cathode conductors (columns) and grid conductors (rows) directly by vacuum deposition through a rigid mask placed on the substrate, which avoids two lithography steps and therefore significantly reduces the production cost of cathode structures.

For example, the following steps could be used to make the cathode conductors (columns) according to the first variant as described above:
produce a metal mask with 0.5 mm openings at a pitch of 1 mm.
put the mask approximately into position (to the nearest 100 μm) and fix it on the support substrate,
deposit cathode conductors (columns) through the mask by evaporation of molybdenum with an electron gun to obtain a thickness of 0.2 μm.

Obviously, a similar procedure could be used to make the cathode conductors (columns) and/or grid conductors (rows) in other variants.

The invention claimed is:

1. A method for manufacturing a triode cathode structure including, on one face of a substrate and stacked together, a resistive layer, a cathode layer structured to form cathode conductors, a layer made of an electrically insulating material, and a grid layer structured to form grid conductors, the method comprising the following successive steps:
depositing the resistive layer on the face of the substrate;
depositing the cathode layer made of an electrically conducting material on the resistive layer;
structuring the cathode layer as cathode conductors arranged in one structure chosen among either a rows structure or a columns structure;
depositing the layer of electrically insulating material on the cathode conductors and the resistive layer;
depositing the grid layer made of an electrically conducting material on the layer of the electrically insulating material;
structuring the grid layer as grid conductors arranged in another structure chosen among either the rows structure or the columns structure;
etching the grid layer structured as grid conductors, the electrically insulating layer, and the cathode layer structured as cathode conductors until reaching the resistive layer so as to provide cavities at an intersection of grid conductors and cathode conductors, wherein this etching step includes, a) depositing a resin layer on the grid layer structured as grid conductors, b) obtaining, by lithography and development of the resin layer, openings in the resin layer organized according to a pattern that will form emissive pads at the bottom of the cavities, c) etching the grid layer structured as grid conductors, according to the pattern, d) etching the electrically insulating layer subjacent to the grid layer structured as grid conductors by extending the etching beyond emissive pad patterns to obtain a width of the cavity greater than the width of the pads, e) etching the grid layer structured as grid conductors at zones exposed by etching of the electrically insulating layer in step d) until reaching the resin layer and etching the cathode layer structured as cathode conductors at zones exposed by the etching of the electrically insulating layer in step d) until the resistive layer is reached so as to give a perforated structure to the cathode layer structured as cathode conductors at the intersection of the cathode conductors and the grid conductors, f) depositing a catalyst layer in openings of the resin layer so as to form emissive pads at the bottom of the cavities, and g) eliminating the resin layer and obtaining the triode cathode structure.

2. The manufacturing method according to claim 1, further comprising:

depositing a barrier layer as a barrier to diffusion of the catalyst in the openings in the resin layer, before a catalyst layer is deposited in the depositing step f).

3. The manufacturing method according to claim 1, in which at least one structuring step among the structuring the cathode layer as cathode conductors and the structuring the grid layer as grid conductors is executed by etching through a mask obtained by photolithography.

4. The manufacturing method according to claim 1, in which the etching the cathode layer as cathode conductors is completed by etching at least part of the thickness of the resistive layer at the zones exposed by the etching of the cathode layer structured as cathode conductors.

5. The manufacturing method according to claim 1, in which at least one structuring step among the structuring the cathode layer as cathode conductors and the structuring the grid layer as grid conductors is executed by deposition through a metallic mask.

6. The manufacturing method according to claim 1, in which the eliminating step g) to eliminate the resin layer is executed by lift-off or by dissolution of the resin layer.

7. The manufacturing method according to claim 1, further comprising growing a nanotube, nanowire, or nanofilament nanostructures on the catalyst layer to form the emissive pads.

8. The manufacturing method according to claim 1, in which the etching step d) to etch the electrically insulating layer is a wet isotropic etching.

* * * * *